(12) United States Patent
Kishima

(10) Patent No.: US 7,994,574 B2
(45) Date of Patent: Aug. 9, 2011

(54) SEMICONDUCTOR SUBSTRATE, SEMICONDUCTOR DEVICE, AND METHOD FOR MANUFACTURING THE SEMICONDUCTOR DEVICE

(75) Inventor: Koichiro Kishima, Kanagawa (JP)

(73) Assignee: Sony Corporation, Tokyo (JP)

( * ) Notice: Subject to any disclaimer, the term of this patent is extended or adjusted under 35 U.S.C. 154(b) by 258 days.

(21) Appl. No.: 12/094,564

(22) PCT Filed: Nov. 17, 2006

(86) PCT No.: PCT/JP2006/323023
§ 371 (c)(1),
(2), (4) Date: May 21, 2008

(87) PCT Pub. No.: WO2007/060895
PCT Pub. Date: May 31, 2007

(65) Prior Publication Data
US 2009/0273061 A1    Nov. 5, 2009

(30) Foreign Application Priority Data

Nov. 24, 2005   (JP) ................................. 2005-339466

(51) Int. Cl.
*H01L 27/12* (2006.01)
(52) U.S. Cl. ........ 257/347; 257/288; 257/353; 257/354; 257/E21.533; 257/E27.112
(58) Field of Classification Search ........... 438/31, 438/403, 404, 412; 257/347, 432, 288, 353, 257/354, E27.112, E21.533
See application file for complete search history.

(56) References Cited

U.S. PATENT DOCUMENTS

| | | | | |
|---|---|---|---|---|
| 5,618,741 A | * | 4/1997 | Young et al. | 438/151 |
| 5,665,613 A | * | 9/1997 | Nakashima et al. | 438/151 |
| 6,329,689 B1 | * | 12/2001 | Manning | 257/347 |
| 6,448,114 B1 | * | 9/2002 | An et al. | 438/142 |

(Continued)

FOREIGN PATENT DOCUMENTS

JP    61-294846    12/1986

(Continued)

OTHER PUBLICATIONS

International Search Report dated Feb. 20, 2007.

*Primary Examiner* — Michelle Estrada
(74) *Attorney, Agent, or Firm* — SNR Denton US LLP

(57) ABSTRACT

A double-structure silicon on insulator (SOI) substrate with a silicon layer, an insulation film (silicon oxide film), a silicon layer, and an insulation film in this order from the side of the surface. The upper-layer insulation film is formed so as to have a uniform distribution of depth while the lower-layer insulation film is formed so as to have a non-uniform distribution of depth so that a thick portion may be formed in the silicon layer along a predetermined path. The refractive index of Si is 3.5 and the refractive index of $SiO_2$ is 1.5. The thick portion of the silicon layer provides a core and the insulation films corresponding to this thick portion provide clads, thereby forming an optical waveguide along the predetermined path. The silicon layer at the side of the surface has a uniform thickness, thereby enabling characteristics of MOS devices fabricated on various portions of the silicon layer to be met with each other easily and facilitating a design of the electrical device as a whole.

18 Claims, 9 Drawing Sheets

U.S. PATENT DOCUMENTS

| | | | |
|---|---|---|---|
| 6,548,369 B1 * | 4/2003 | van Bentum | 438/404 |
| 6,936,881 B2 * | 8/2005 | Yeo et al. | 257/310 |
| 7,110,629 B2 * | 9/2006 | Bjorkman et al. | 385/14 |
| 7,141,459 B2 * | 11/2006 | Yang et al. | 438/154 |

FOREIGN PATENT DOCUMENTS

| | | |
|---|---|---|
| JP | 05-299345 | 11/1993 |
| JP | 08-167646 | 6/1996 |
| JP | 11-233449 | 8/1999 |
| JP | 11-329999 | 11/1999 |
| JP | 2000-216107 | 8/2000 |
| JP | 2002-014242 | 1/2002 |
| JP | 2004-505310 | 9/2002 |
| JP | 2002-299591 | 10/2002 |
| JP | 2002-323633 | 11/2002 |
| JP | 2003-124305 | 4/2003 |
| JP | 2005-251878 | 9/2005 |

* cited by examiner

FIG. 5
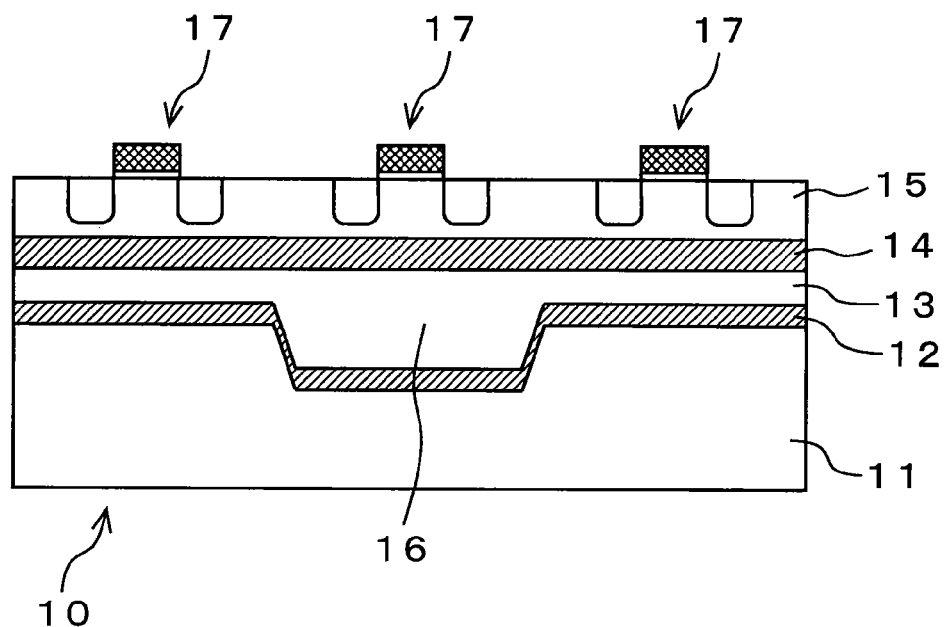
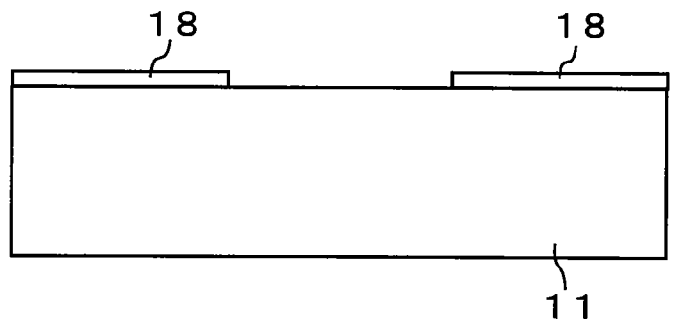
FIG. 6A
(FORMATIOPN OF MASK)
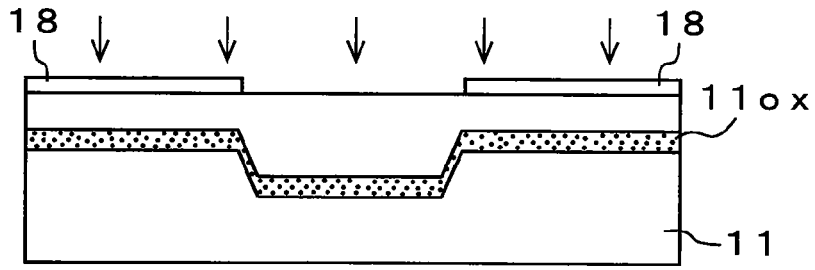
FIG. 6B
(IMPLANTATION OF OXYGEN IONS)

(ANNEALING AT HIGH TEMPERATURE)

(FORMATION OF DOUBLE-STRUCTURE SOI SUBSTRATE)

(FORMATION OF ELECTRICAL DEVICES)

(PROVIDING OF SOI SUBSTRATE)

(IMPLANTATION OF OXYGEN IONS)

(ANNEALING AT HIGH TEMPERATURE)

(ADJUSTMENT OF THICKNESS)

(PROVIDING OF SOI SUBSTRATE)

(PROVIDING OF SILICON SUBSTRATE)

(BONDING)

(ADJUSTMENT OF THICKNESS)

(PROVIDING OF SOI SUBSTRATE)

(PROVIDING OF SILICON SUBSTRATE)

(BONDING)

(SEPARATION OF SUBSTRATE)

(POLISHING)

SEMICONDUCTOR SUBSTRATE, SEMICONDUCTOR DEVICE, AND METHOD FOR MANUFACTURING THE SEMICONDUCTOR DEVICE

TECHNICAL FIELD

The present invention relates to a semiconductor substrate that has a semiconductor layer on an insulator layer, a semiconductor device that uses the same, and a method for manufacturing the semiconductor substrate. More specifically, the present invention relates to a semiconductor substrate and the like which employs such a configuration that a first insulator layer and a second insulator layer are formed in this order from a side of a surface in the vicinity of the surface, the first insulator layer has a uniform distribution of depth, and a semiconductor layer sandwiched between the first and second insulator layers has a thick portion at a predetermined position, thereby facilitating a design of an electrical device to be formed in a semiconductor layer at the side of the surface in a case of forming the thick portion at the semiconductor layer sandwiched between the two insulator layers.

BACKGROUND ART

Conventionally, it has been proposed to form an optical waveguide on a silicon-on-insulator (SOI) substrate, in order to realize optical communication by use of the optical waveguide between function sections formed in this SOI substrate.

For example, Japanese Patent Application Publication Nos. 2002-14242 and 2002-323633 have disclosed that by using as a lower part clad an embedded silicon oxide film serving as an insulator layer of the SOI substrate, processing a silicon layer serving as a semiconductor layer of this SOI substrate to form a core, and depositing a silicon oxide film on the surface of this SOI substrate to form an upper part clad, an optical waveguide having a large specific refractivity difference is obtained.

In a case of forming an optical waveguide on the SOI substrate as described in the above-mentioned Japanese Patent Application Publication Nos. 2002-14242 and 2002-323633, the silicon layer at a side of the surface is utilized as the core of the optical waveguide. Therefore, it is impossible to form an electrical device at a portion in the SOI substrate where the optical waveguide is formed, which is made inconvenient when miniaturizing a system-on-chip (SOC) device that uses, for example, the SOI substrate.

Accordingly, it is conceived to employ an SOI substrate (hereinafter referred to as "double-structure SOI substrate") in which insulator layers are formed doubly in the vicinity of its surface so that those two insulator layers and a semiconductor layer sandwiched by them may constitute an optical waveguide. FIG. 1 shows a configuration of the double-structure SOI substrate 50 in which an optical waveguide is formed.

This double-structure SOI substrate 50 has such a configuration that on a silicon substrate 51, a silicon layer (mono-crystal silicon film) 53 is formed via an insulation film (silicon oxide film) 52 and on this silicon layer 53, a silicon layer (mono-crystal silicon film) 55 is formed via an insulation film (silicon oxide film) 54.

In this case, the lower-layer insulation film 52 is formed so as to have a uniform distribution of depth, while on the other hand, the upper-layer insulation film 54 is formed so as to have a non-uniform distribution of depth so that the silicon layer 53 sandwiched between the insulation films 52 and 54 may have a thick portion formed along a predetermined path. Herein, since the refractive index of silicon (Si) is 3.5 and the refractive index of silicon dioxide ($SiO_2$) is 1.5, the thick portion of the silicon layer 53 provides a core and the insulation films 52 and 54 corresponding to this thick portion provide clads, thereby forming an optical waveguide 56 along the predetermined path.

FIG. 2 shows a semiconductor device in which on the silicon layer 55 at the side of the surface of this double-structure SOI substrate 50, electrical devices 57, for example, MOS devices or the like, constituting a central processing unit (CPU), a memory, or the like are formed.

Since the insulation films 52 and 54 and the silicon layer 53 sandwiched between them constitute the optical waveguide 56 in the double-structure SOI substrate 50, the electrical devices 57 can be formed even on the silicon layer 55 right above this optical waveguide 56. Accordingly, by using this double-structure SOI substrate 50, the SOC device can be miniaturized.

In this double-structure SOI substrate 50, however, the upper-layer insulation film 54 has not uniform distribution of depth, so that the silicon layer 55 at a side of the surface is not uniform in thickness. Therefore, when forming, for example, MOS devices on the silicon layer 55, it is difficult to meet the characteristics of the MOS devices formed on the thin portion of the silicon layer 55 corresponding to the optical waveguide 56 with the characteristics of the MOS devices formed on the thick portion of the silicon layer 55 not corresponding to the optical waveguide 56. Further, mixture of the MOS devices having the different characteristics leads to complexity in a design of the electrical devices as a whole.

DISCLOSURE OF INVENTION

A concept of this invention relates to a semiconductor substrate characterized in that the semiconductor substrate comprises a first semiconductor layer, a first insulator layer, a second semiconductor layer, and a second insulator layer in this order from a side of a surface, wherein:

said first insulator layer has a uniform distribution of depth; and said second semiconductor layer has a thick portion at a predetermined position.

In this invention, the semiconductor substrate contains the first semiconductor layer, the first insulator layer, the second semiconductor layer, and the second insulator layer in this order from the side of the surface. The upper-layer first insulator layer has a uniform distribution of depth and the second semiconductor layer has the thick portion at the predetermined position. In this case, in order to provide the thick portion in the second semiconductor layer, the lower-layer second insulator layer has a non-uniform distribution of depth. This thick portion constitutes, for example, an optical waveguide and by forming the thick portion along the predetermined path, an optical waveguide is formed along the predetermined path.

For example, the semiconductor substrate according to the invention is manufactured as followings. Oxygen ions are first implanted into the semiconductor substrate in a condition where a predetermined pattern mask is formed on this semiconductor substrate and then thermal treatment is conducted on this semiconductor substrate, thereby forming a second insulator layer having a non-uniform distribution of depth. Next, oxygen ions are implemented into the semiconductor substrate in a condition where the predetermined pattern mask is removed from this semiconductor substrate and then thermal treatment is conducted on this semiconductor substrate, thereby forming a first insulator layer having a uniform distribution of depth above the second insulator layer.

Alternatively, for example, the semiconductor substrate according to the invention is manufactured as followings. Oxygen ions are first implemented into a first semiconductor substrate in a condition where a predetermined pattern mask is formed on the first semiconductor substrate and then thermal treatment is conducted on this first semiconductor substrate, thereby forming a second insulator layer having a non-uniform distribution of depth. Next, a second semiconductor substrate having the first insulator layer with the uniform distribution of depth is joined to a surface of the first semiconductor substrate. Further, a thickness of a semiconductor layer at a surface of a semiconductor substrate thus obtained by joining the second semiconductor substrate to a surface of the first semiconductor substrate is decreased. For example, when decreasing the thickness of the semiconductor layer at a surface thereof, a step of performing cleavage a previously determined position by ion implantation and a step of polishing a surface given after this cleavage are carried out.

On the semiconductor layer at the side of the surface of the semiconductor substrate according to the present invention, electrical devices that constitute, for example, a CPU or a memory are formed, thereby obtaining a predetermined semiconductor device. In this case, since the upper-layer first insulator layer has the uniform distribution of depth, the first semiconductor layer at the side of the surface has a uniform thickness. Therefore, if forming, for example, MOS devices on the semiconductor layer at the side of the surface, it is possible to easily meet the characteristics of the MOS device fabricated on a portion of the first semiconductor layer that corresponds to the thick portion of the second semiconductor layer with the characteristics of the MOS device fabricated on a portion of the first semiconductor layer that does not correspond to the thick portion of the second semiconductor layer, thereby facilitating the design of the electrical devices as a whole.

According to the present invention, the first insulator layer and the second insulator layer are formed in this order from the side of the surface in the vicinity of the surface, the first insulator layer has a uniform distribution of depth, and the semiconductor layer sandwiched between the first and second insulator layers has the thick portion at the predetermined position thereof, thereby facilitating the design of the electrical device to be formed in the semiconductor layer at the side of the surface in a case of forming the thick portion at the semiconductor layer sandwiched between the two insulator layers.

BRIEF DESCRIPTION OF DRAWINGS

[FIG. 5] is a cross-sectional view for illustrating a semiconductor device which employs the double-structure SOI substrate.

[FIG. 6A] is a diagram for showing a step of manufacturing a semiconductor substrate (semiconductor device).

[FIG. 6B] is a diagram for showing a step of manufacturing a semiconductor substrate (semiconductor device).

BEST MODE FOR CARRYING OUT THE INVENTION

Figure 1:
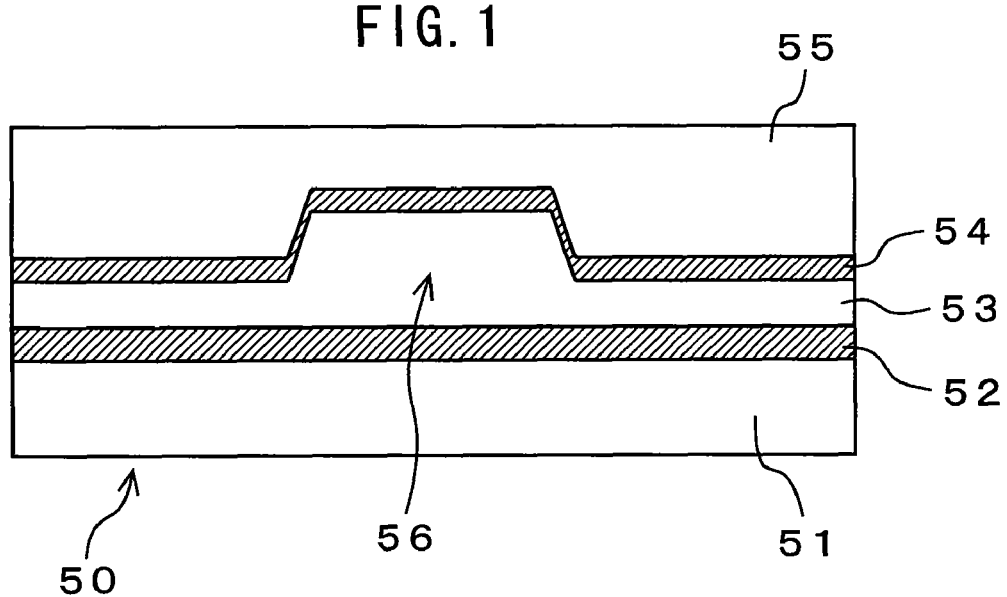
[FIG. 1] is a cross-sectional view for showing a configuration example of a double-structure SOI substrate.
Figure 2:
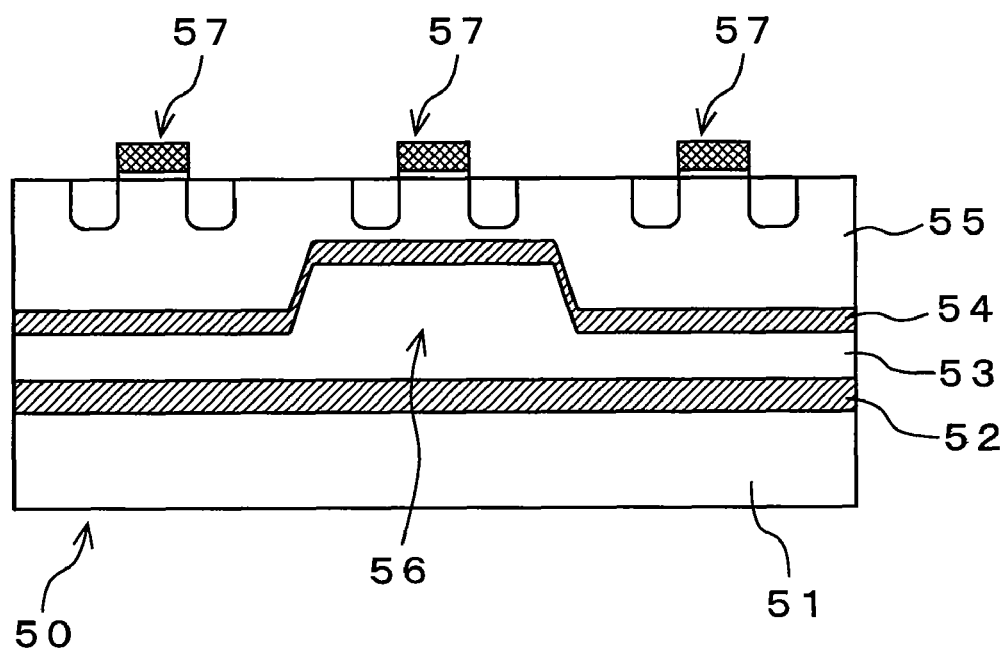
[FIG. 2] is a diagram for illustrating a semiconductor device which employs the double-structure SOI substrate.
Figure 3:
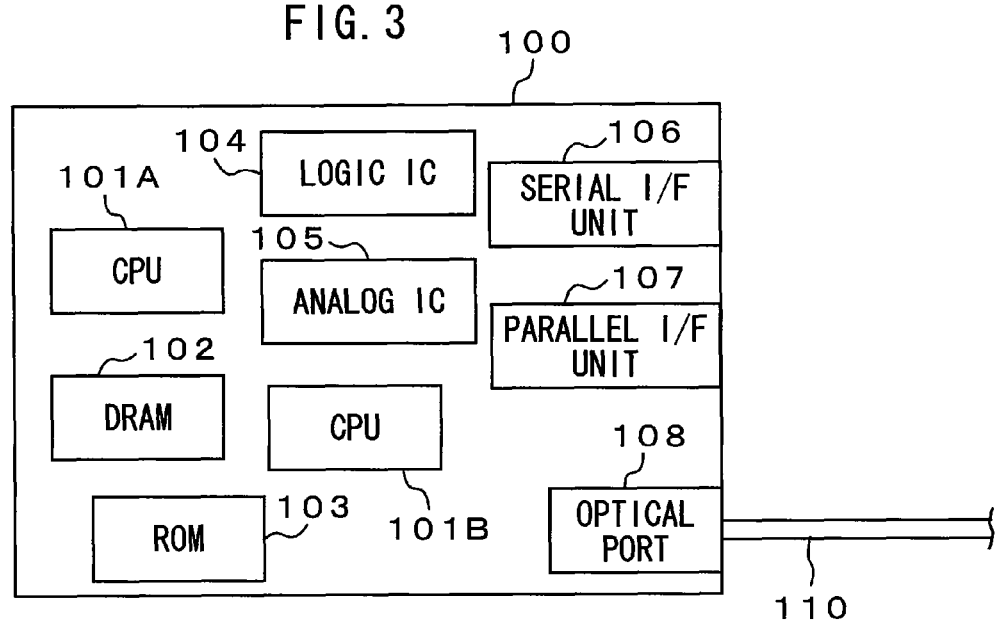
[FIG. 3] is a diagram for showing one example of an SOC device to which the present invention can be applied.

Embodiments of the present invention will be described. FIG. 3 shows a system on chip (SOC) device 100 to which the present invention can be applied. This SOC device 100 is a system LSI (large scale integrated circuit) that is provided with two central processing units (CPUs) 101A and 101B, a dynamic random access memory (DRAM) 102, a read only memory (ROM) 103, a logic IC 104, an analog IC 105, a serial I/F unit 106, a parallel I/F unit 107, and an optical port 108. To the optical port 108 of this SOC device 100, an optical fiber 110 is connected for communication with an outside.

Figure 4:
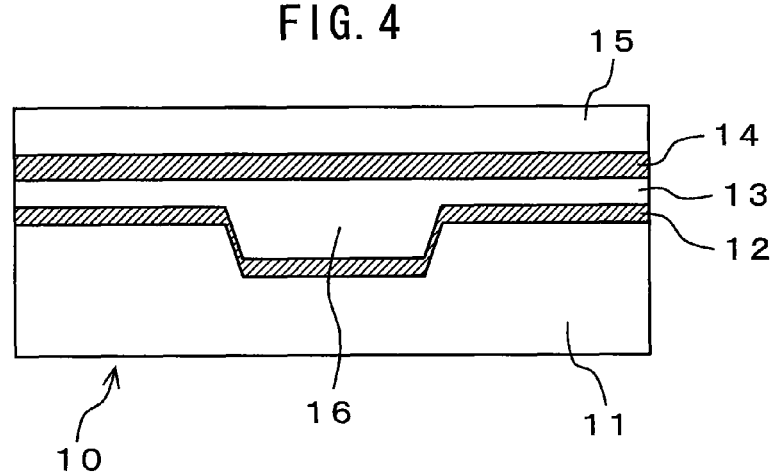
[FIG. 4] is a cross-sectional view for showing a configuration of a double-structure SOI substrate.

This SOC device 100 is formed as a double-structure SOI substrate 10. FIG. 4 shows a configuration of the double-structure SOI substrate 10. This double-structure SOI substrate 10 is formed as to have such a configuration that a silicon layer (mono-crystal silicon film) 13 is formed via an insulation film (silicon oxide film) 12 on a silicon substrate 11 and on this silicon layer 13, a silicon layer (mono-crystal silicon film) 15 is formed via an insulation film (silicon oxide film) 14.

That is, the double-structure SOI substrate 10 contains the silicon layer 15, the insulation film 14, the silicon layer 13, and the insulation film 12 in this order from the side of the surface. Herein, the silicon layer 15 constitutes a first semiconductor layer, the insulation film 14 constitutes a first insulator layer, the silicon layer 13 constitutes a second semiconductor layer, and the insulation film 12 constitutes a second insulator layer.

In this double-structure SOI substrate 10, the upper-layer insulation film 14 is formed so as to have a uniform distribution of depth while on the other hand, the lower-layer insulation film 12 is formed so as to have a non-uniform distribution of depth so that the silicon layer 13 sandwiched between the insulation films 12 and 14 may have a thick portion formed along a predetermined path. Herein, since the refractive index of silicon (Si) is 3.5 and the refractive index of silicon dioxide (SiO$_2$) is 1.5, the thick portion of the silicon layer 13 provides a core and the insulation films 12 and 14 corresponding to this thick portion provide clads, thereby forming an optical waveguide 16 along the predetermined path.

In the above-mentioned SOC device 100, optical communication is carried out using an optical waveguide between, for example, the CPU 101A and CPU 101B. As described above, the optical waveguide 16 formed on the double-structure SOI substrate 10 is used for the above-mentioned optical communication.

The above-mentioned SOC device 100 is a semiconductor device in which electrical devices 17, for example, MOS devices and the like, which constitute a CPU, a memory, or the like are formed on the silicon layer 15 at the side of the surface of the double-structure SOI substrate 10 as shown in FIG. 5.

In this double-structure SOI substrate 10, the optical waveguide 16 is formed by the insulation films 12 and 14 and the silicon layer 13 sandwiched between them, so that the electrical device 17 can be formed even on the silicon layer 15 right above this optical waveguide 16. Therefore, by using such a double-structure SOI substrate 10, the SOC device can be miniaturized.

Further, since the upper-layer insulation film 14 has a uniform distribution of depth in this double-structure SOI substrate 10, the silicon layer 15 at the side of the surface has a uniform thickness. Therefore, in a case of forming, for example, MOS devices on the silicon layer 15, it is easily possible to meet the characteristics of the MOS device fabricated on a portion of the silicon layer 15 that corresponds to the thick portion of the silicon layer 13 with the characteristics of the MOS device fabricated on a portion of the silicon layer 15 that does not correspond to the thick portion of the silicon layer 13, thereby facilitating the design of the electrical devices as a whole.

Next, the steps of manufacturing the double-structure SOI substrate 10 described above and a semiconductor device that employs the double-structure SOI substrate 10 will be described with reference to FIGS. 6A-6E.

First, as shown in FIG. 6A, the surface of the silicon substrate 11 is thermally oxidized to form a silicon oxide film thereon and then patterned to form a mask 18 with removing this silicon oxide film in accordance with a pattern of the optical waveguide.

Next, as shown in FIG. 6B, oxide ions are implanted (as shown by arrows) in a condition where the mask 18 is disposed onto the surface of the silicon substrate 11, thereby forming an oxide-ion-implanted layer 11$ox$ in the silicon substrate 11. In this case, in portions where the mask 18 is disposed, the ion velocity is decelerated due to the mask 18 so that the oxide ions are implanted shallowly, and in portions where the mask 18 is not disposed, the oxide ions are implanted deeply.

Figure 6C:
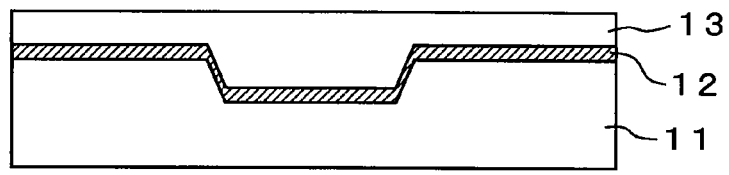
[FIG. 6C] is a diagram for showing a step of manufacturing a semiconductor substrate (semiconductor device).

Next, as shown in FIG. 6C, by performing high-temperature annealing treatment on the silicon substrate 11 in which the oxide-ion-implanted layer is formed through the implantation of oxide ions, the implanted oxide ions and the silicon are reacted with each other to form an insulation film (silicon oxide film) 12 in the silicon substrate 11. The insulation film 12 is formed deep partially corresponding to the optical waveguide pattern and so has a non-uniform distribution of depth. By forming this insulation film 12, the original silicon substrate 11 is divided into two in the depth direction, thus forming the silicon layer (mono-crystal silicon film) 13 on the insulation film 12. It should be noted that the mask 18 is removed before or after the annealing treatment or after the substrate is annealed to some extent. Further, there are some cases where a surface protection layer may be formed before the step of annealing in order to prevent the occurrence of unnecessary oxidation during the annealing step.

Figure 6D:
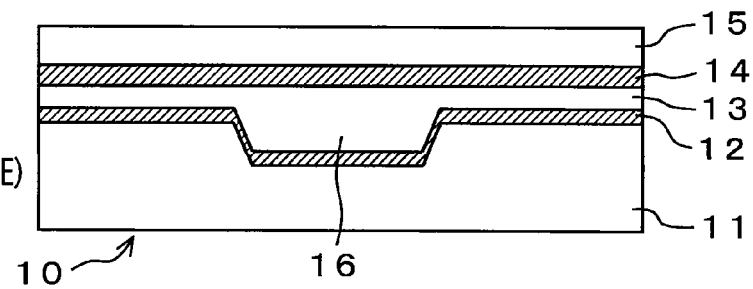
[FIG. 6D] is a diagram for showing a step of manufacturing a semiconductor substrate (semiconductor device).

Next, as shown in FIG. 6D, relative to the substrate formed as shown in FIG. 6C, the insulation film (silicon oxide film) 14 and the silicon layer (mono-crystal silicon film) 15 are formed on the silicon layer 13 by using a conventionally well-known SOI substrate fabrication technology, thereby obtaining the double-structure SOI substrate 10. This insulation film 14 has a uniform distribution of depth, so that the silicon layer 15 also has a uniform depth. In this case, a thick portion is formed in the silicon layer 13 corresponding to the optical waveguide pattern, thus providing the optical waveguide 16.

Figure 6E:
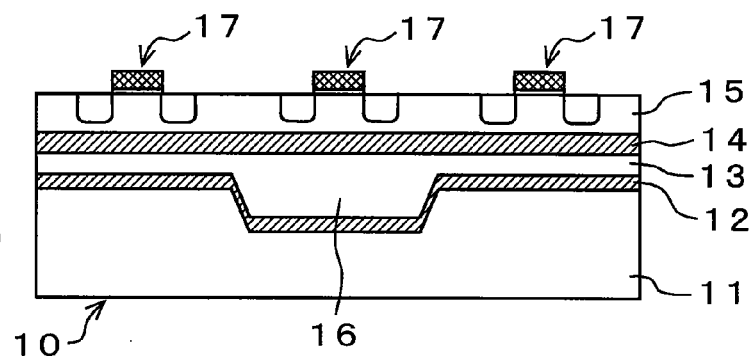
[FIG. 6E] is a diagram for showing a step of manufacturing a semiconductor substrate (semiconductor device).

Next, as shown in FIG. 6E, the electrical devices 17, for example, MOS devices or the like, which constitute a CPU, a memory, and the like are formed on the silicon layer 15 at the side of the surface, thereby forming a semiconductor device, for example, the SOC device 100 (see FIG. 3), that employs the double-structure SOI substrate 10.

The following will describe further manufacturing steps for obtaining the double-structure SOI substrate 10 shown in FIG. 6D from the substrate shown in FIG. 6C as described above. Herein, the manufacturing steps will be described which employ any one of (1) the silicon implanted oxide (SIMOX) method, (2) the bonding (polishing) method, (3) the bonding (smart-cut method), and the like.

The double-structure SOI substrate manufacturing steps by use of the (1) SIMOX method will be described (see FIGS. 7A-7D).

Figure 7A:
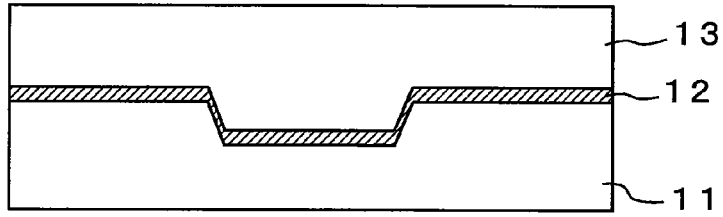
[FIG. 7A] is a diagram for showing a step of manufacturing the double-structure SOI substrate according to an SIMOX method.

First, as shown in FIG. 7A, the substrate (SOI substrate) shown in FIG. 6C is provided. This substrate is obtained by forming the silicon layer 13 via the insulation film (silicon oxide film) 12 on the silicon substrate 11. The silicon layer 13 is supposed to have such a thickness as required in an epitaxial growth step and the like.

Figure 7B:
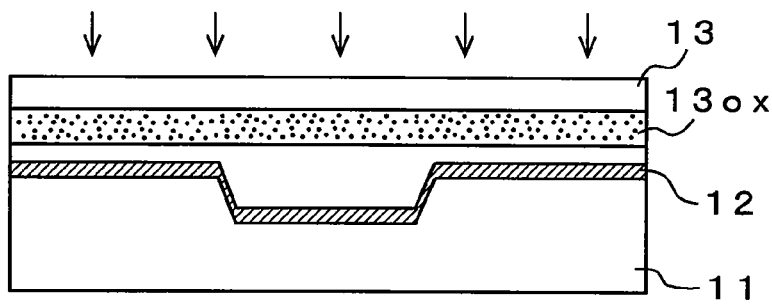
[FIG. 7B] is a diagram for showing a step of manufacturing the double-structure SOI substrate according to the SIMOX method.

Next, as shown in FIG. 7B, oxide ions are implanted (as indicated by arrows) through the surface of the silicon layer 13, thereby forming an oxide-ion-implanted layer 13$ox$ in this silicon layer 13. In this case, the oxide ions are implanted to the same depth everywhere on the surface of the substrate.

Figure 7C:
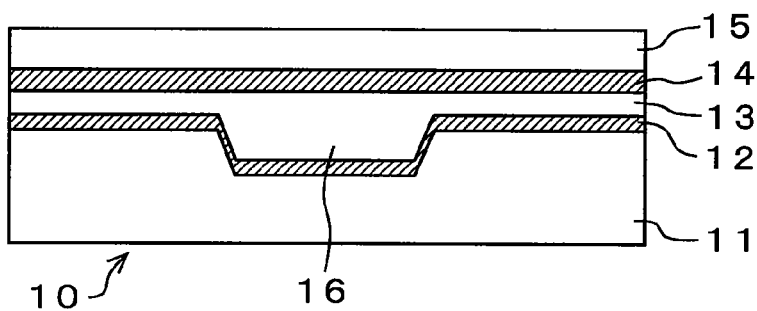
[FIG. 7C] is a diagram for showing a step of manufacturing the double-structure SOI substrate according to the SIMOX method.

Next, as shown in FIG. 7C, high-temperature annealing treatment is performed to react the implanted oxide ions and the silicon with each other, thereby forming the insulation film 14 formed of a silicon oxide film in the silicon layer 13. This insulation film 14 is formed as to have a uniform distribution of depth. By forming the insulation film 14, the original silicon layer 13 is divided into two in the depth direction, thus resulting in such a situation that the silicon layer (monocrystal silicon film) 15 is formed on the insulation film 14.

By thus forming the insulation film 14, the insulation film 12, the silicon layer 13, the insulation film 14, and the silicon layer 15 are formed on the silicon substrate 11 in this order, thereby obtaining the double-structure SOI substrate 10 in which the optical waveguide 16 is formed at the thick portion of the silicon layer 13 that is sandwiched between the insulation films 12 and 14.

Figure 7D:
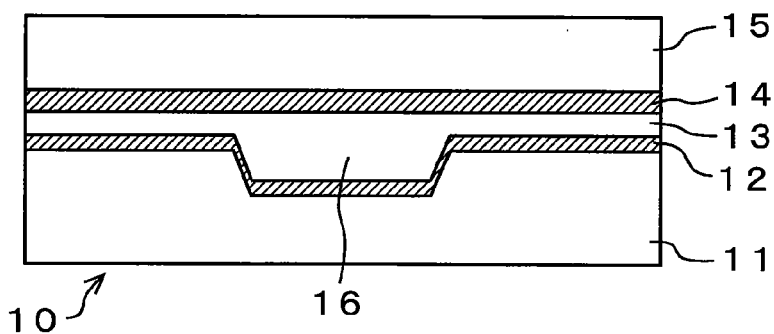
[FIG. 7D] is a diagram for showing a step of manufacturing the double-structure SOI substrate according to the SIMOX method.

Next, as shown in FIG. 7D, the thickness of the silicon layer 15 is adjusted to a predetermined thickness thereof. For example, the thickness will be increased by a step of epitaxial growth or decreased by a step of forming a thermally oxidized film and etching.

The double-structure SOI substrate manufacturing steps by use of the (2) bonding (polishing) method will be described (see FIGS. 8A-8D).

Figure 8A:
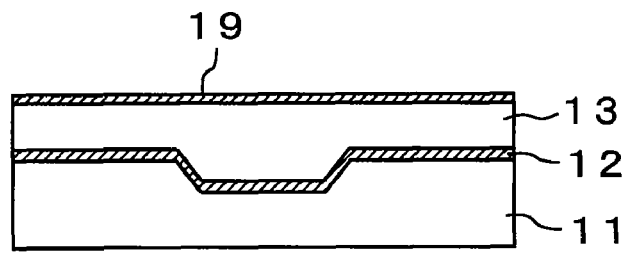
[FIG. 8A] is a diagram for showing a step of manufacturing the double-structure SOI substrate according to a bonding (polishing) method.

First, as shown in FIG. 8A, the substrate (SOI substrate) shown in FIG. 6C is provided. This substrate is obtained by forming the silicon layer 13 via the insulation film (silicon oxide film) 12 on the silicon substrate 11. Then, the surface of the silicon layer 13 is thermally oxidized to form the silicon oxide film 19 thereon. The silicon layer 13 is supposed to have such a thickness as required in an epitaxial growth step and the like.

Figure 8B:
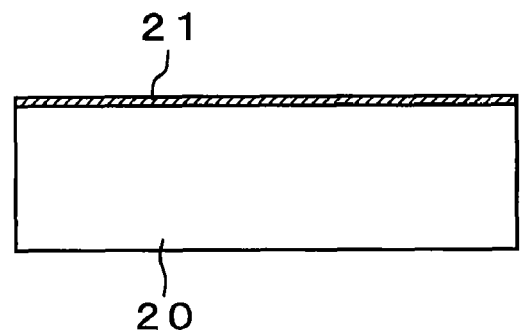
[FIG. 8B] is a diagram for showing a step of manufacturing the double-structure SOI substrate according to the bonding (polishing) method.

Further, as shown in FIG. 8B, the silicon substrate 20 is provided and thermally oxidized to form the silicon oxide film 21 on its surface.

Figure 8C:
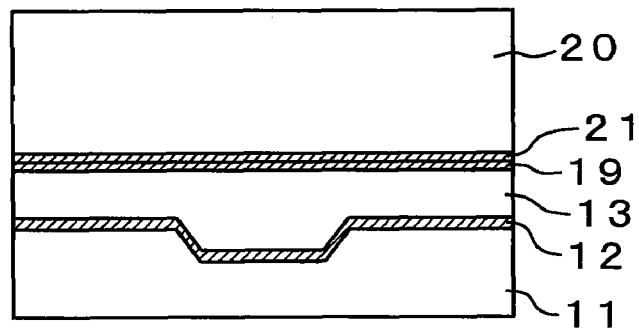
[FIG. 8C] is a diagram for showing a step of manufacturing the double-structure SOI substrate according to the bonding (polishing) method.

Next, as shown in FIG. 8C, the silicon substrate 20 provided as shown in FIG. 8B is bonded to the SOI substrate provided as shown in FIG. 8A. In this case, the silicon oxide film 21 of the silicon substrate 20 is put over the silicon oxide film 19 of the SOI substrate and they are joined with each other by applying heat and pressure.

Figure 8D:
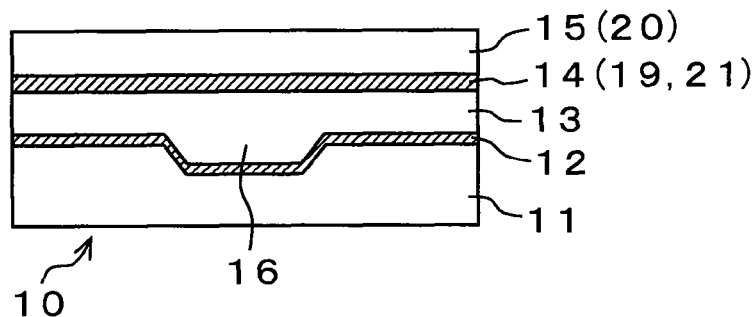
[FIG. 8D] is a diagram for showing a step of manufacturing the double-structure SOI substrate according to the bonding (polishing) method.

Next, as shown in FIG. 8D, the thickness of the silicon layer 15 at the side of the surface is adjusted to have a predetermined thickness by polishing such as chemical mechanical polishing (CMP). In such a manner, the insulation film 12, the silicon layer 13, the insulation film 14, and the silicon layer 15 are formed on the silicon substrate 11 in this order, thereby obtaining the double-structure SOI substrate 10 in which the optical waveguide 16 is formed at the thick portion of the silicon layer 13 that is sandwiched between the insulation films 12 and 14.

The double-structure SOI substrate manufacturing steps by use of the (3) bonding (smart-cut) method will be described (see FIGS. 9A-9E).

Figure 9A:
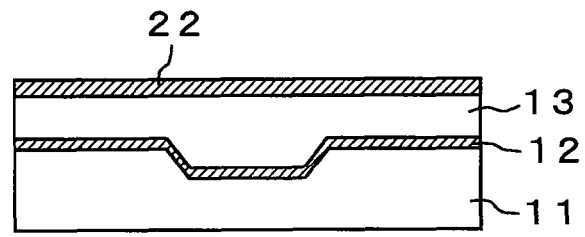
[FIG. 9A] is a diagram for showing a step of manufacturing the double-structure SOI substrate according to a bonding (smart-cut) method.

First, as shown in FIG. 9A, the substrate (SOI substrate) shown in FIG. 6C is provided. This substrate is obtained by forming the silicon layer 13 via the insulation film (silicon oxide film) 12 on the silicon substrate 11. Then, the surface of the silicon layer 13 is thermally oxidized to form a silicon oxide film 22 thereon. The silicon layer 13 is supposed to have such a thickness as required in an epitaxial growth step and the like.

Figure 9B:
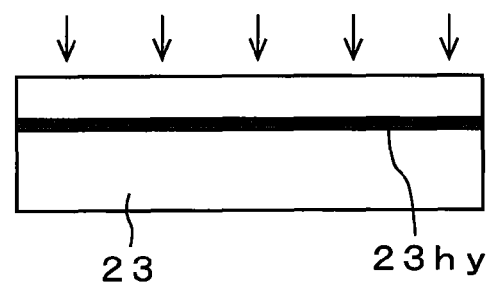
[FIG. 9B] is a diagram for showing a step of manufacturing the double-structure SOI substrate according to the bonding (smart-cut) method.

Further, as shown in FIG. 9B, a silicon substrate 23 is provided. Into this silicon substrate 23, hydrogen ions are implanted (as shown by arrows) to form a hydrogen-ion-implanted layer 23$hv$, so that a substrate separation position can be defined.

Figure 9C:
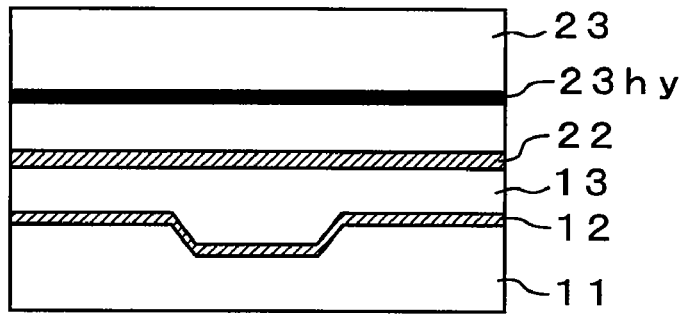
[FIG. 9C] is a diagram for showing a step of manufacturing the double-structure SOI substrate according to the bonding (smart-cut) method.

Next, as shown in FIG. 9C, the silicon substrate 23 provided as shown in FIG. 9B is bonded to the SOI substrate provided as shown in FIG. 9A. In this case, a surface of the silicon substrate is put over the silicon oxide film 22 of the SOI substrate and they are joined with each other by applying heat and pressure.

Figure 9D:
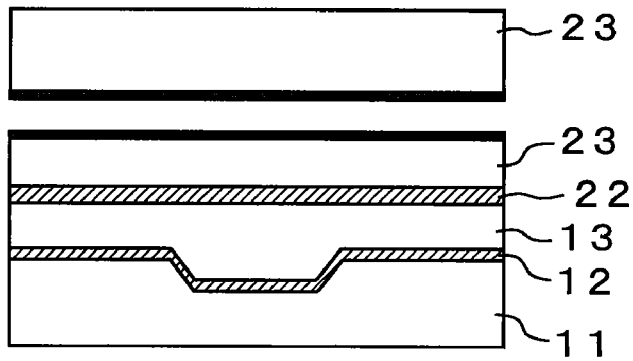
[FIG. 9D] is a diagram for showing a step of manufacturing the double-structure SOI substrate according to the bonding (smart-cut) method.
Figure 9E:
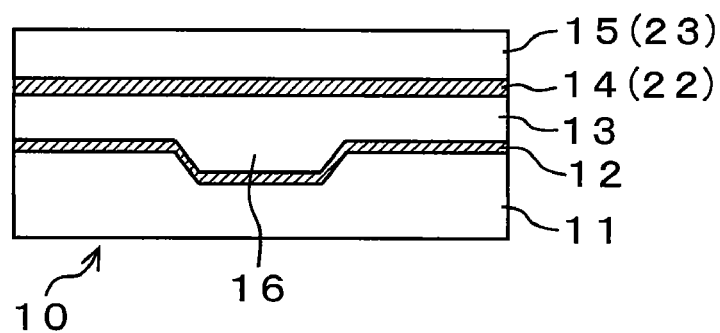
[FIG. 9E] is a diagram for showing a step of manufacturing the double-structure SOI substrate according to the bonding (smart-cut) method.

Next, as shown in FIG. 9D, by applying heat up to a temperature at which there occurs a phenomenon such that this substrate will be separated due to the concentration of the hydrogen of the implanted ions, the silicon substrate 23 is cut and separated at the substrate separation position. Then, as shown in FIG. 9E, the silicon substrate 23 is polished on its separation position and finished. In such a manner, the insulation film 12, the silicon layer 13, the insulation film 14, and the silicon layer 15 are formed on the silicon substrate 11 in this order, thereby obtaining the double-structure SOI substrate 10 in which the optical waveguide 16 is formed at the thick portion of the silicon layer 13 that is sandwiched between the insulation films 12 and 14.

It should be noted that a substrate made of germanium, strained silicon, silicon-germanium, and the like in place of the silicon substrate 20 employed in the above-described bonding (polishing) method or the silicon substrate 23 employed in the above-described bonding (smart-cut) method can be used to manufacture a substrate similar to the double-structure SOI substrate 10 and such the substrate can be used in place of the double-structure SOI substrate 10. Also, it may be considered that in place of the silicon layer 13 employed in the SIMOX method, a semiconductor layer made of germanium, strained silicon, silicon-germanium, and the like can be used to form the insulation film 14 in this semiconductor layer, thereby manufacturing a substrate similar to the double-structure SOI substrate 10 and such the substrate can be used in place of the double-structure SOI substrate 10.

Further, in the above embodiment, the double-structure SOI substrate 10 is formed, as shown in FIG. 4, so that the insulation film 12 and the insulation film 14 are separated from each other by the silicon layer 13 interposed between them also at those positions other than the thick portion in which the silicon layer 13 constitutes the optical waveguide 16.

Figure 10:
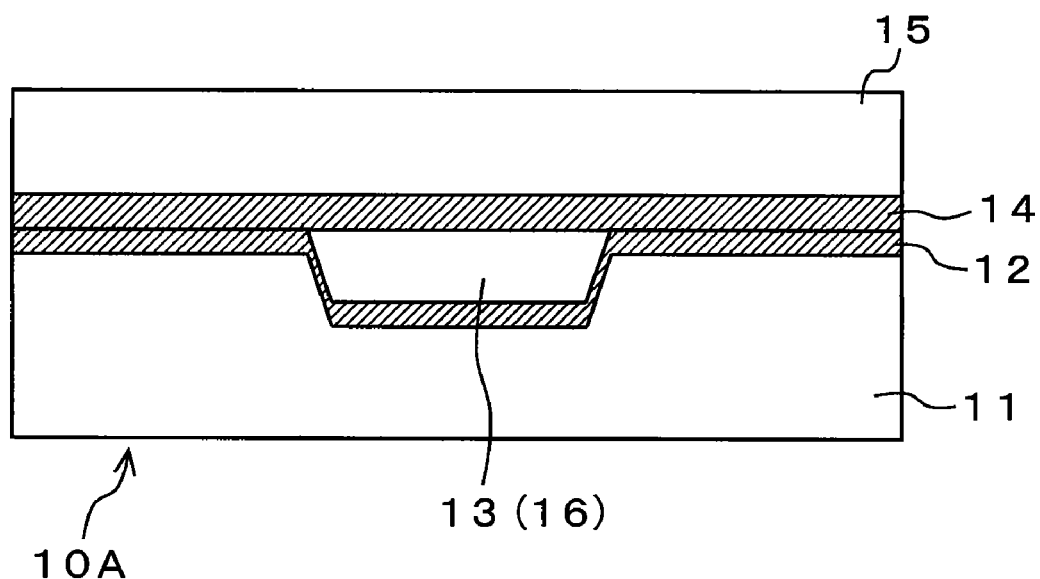
[FIG. 10] is a cross-sectional view for showing another configuration of the double-structure SOI substrate.
Figure 11:
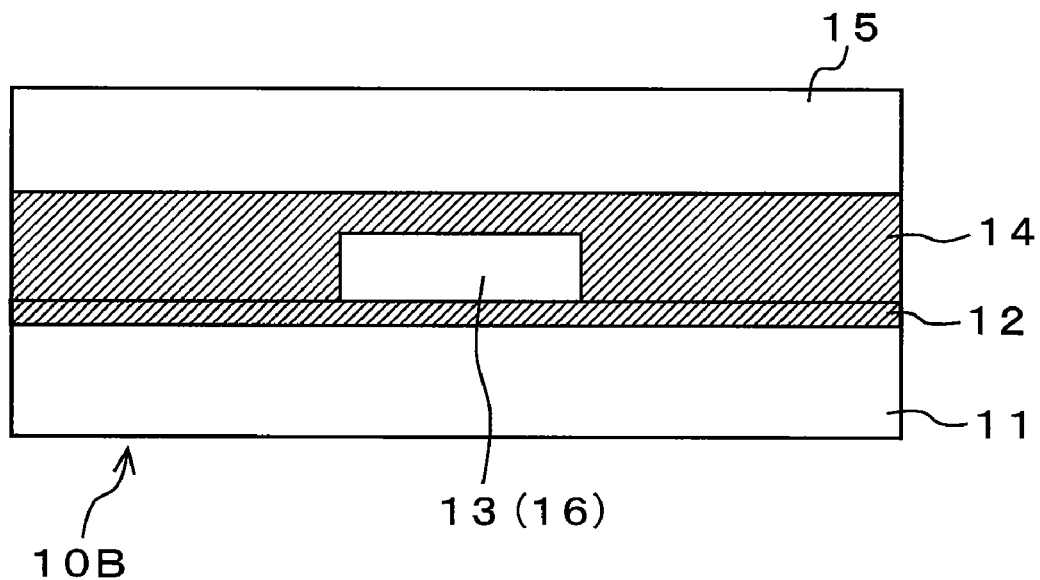
[FIG. 11] is a cross-sectional view for showing further configuration of the double-structure SOI substrate.

However, as shown in FIG. 10 and FIG. 11, respectively, such double-structure SOI substrates 10A and 10B may be considered that there is a silicon layer 13 only at the position where the silicon layer 13 constitutes the optical waveguide 16 and thus, the insulation films 12 and 14 are in contact with each other at the other positions.

The double-structure SOI substrate 10A shown in FIG. 10 is manufactured by, for example, providing such an SOI substrate as shown in FIG. 6C, polishing the silicon layer 13 in such a manner that this silicon layer 13 may exist only at the position where the silicon layer 13 constitutes the optical waveguide 16, and bonding on it the silicon substrate (silicon layer) 15 in which the insulation film (silicon oxide film) 14 is formed.

The double-structure SOI substrate 10B shown in FIG. 11 is manufactured by, for example, providing an ordinary SOI substrate in which the insulation film 12 and the silicon layer 13 are formed on the silicon substrate 11 and the insulation film 12 has a uniform distribution of depth, etching the substrate in such a manner that the silicon layer 13 may remain only at the position of the optical waveguide 16, depositing the insulation film (silicon oxide film) 14 and flattening its surface, and depositing the silicon layer 15 on this insulation film 14.

INDUSTRIAL APPLICABILITY

In a case of forming a thick portion in a semiconductor layer sandwiched between two insulator layers and utilizing it as, for example, an optical waveguide, the present invention can facilitate the design of the electrical devices to be formed on the semiconductor layer at the side of the first surface and can be applied to a semiconductor device (SOC device) in which an optical waveguide is formed in its substrate to establish optical communication between predetermined function sections.

The invention claimed is:

1. A semiconductor substrate comprising, when viewed in cross section:
   a first semiconductor layer;
   a first insulator layer on the first semiconductor layer;
   a second semiconductor layer on the first insulator layer;
   a second insulator layer on the second semiconductor layer; and
   a substrate on the second insulator layer;
   wherein,
   said first insulator layer has a uniform thickness, and
   said second semiconductor layer has a relatively thicker portion between two relatively thinner portions, the thicker portion and the thinner portions are between the first insulator layer and the second insulator layer.

2. The semiconductor substrate according to claim 1, characterized in that said relatively thicker portion constitutes an optical waveguide.

3. A semiconductor device comprising:
   a semiconductor substrate comprising, when viewed in cross section, (a) a first semiconductor layer, (b) a first insulator layer on the first semiconductor layer, (c) a second semiconductor layer on the first insulator layer, (d) a second insulator layer on the second semiconductor layer, and (e) a silicon substrate on the second insulator layer; and
   electrical devices on said first semiconductor layer, wherein,
   said first insulator layer has a uniform thickness, and
   said second semiconductor layer has a relatively thicker portion between relatively thinner portions, the thicker portion and the thinner portions are established between the first insulator layer and the second insulator layer.

4. The semiconductor substrate according to claim 1, wherein the semiconductor substrate is a finalized product, and the semiconductor substrate is a double-structure silicon-on-insulator (SOI) substrate.

5. The semiconductor substrate according to claim 4, wherein the thicker portion provides a core along a predetermined path and the first insulator layer and the second insulator layer abutting the thicker portion provide clads forming an optical waveguide along the predetermined path.

6. The semiconductor substrate according to claim 4, wherein the double-structure SOI substrate is integrated in a first central processing unit and a second processing unit enabling optical communication.

7. The semiconductor substrate according to claim 5, wherein the first semiconductor layer, the first insulator layer, the second semiconductor layer, the second insulator layer, and the substrate are formed consecutively.

8. The semiconductor substrate according to claim 1, wherein digital logic, a central processing unit, or a memory, is formed on the first semiconductor layer.

9. The semiconductor substrate according to claim 1, wherein the first semiconductor layer and the second semiconductor layer are silicon layers, and the first insulation film and the second insulation film are silicon oxide.

10. The semiconductor substrate according to claim 1, wherein the thicker portion extends toward the substrate.

11. The semiconductor substrate according to claim 1, wherein an upper portion of the thicker portion horizontally aligns with the first insulator layer, and wherein a lower portion of the thicker portion extends into the substrate below.

12. The semiconductor device according to claim 3, wherein the semiconductor substrate is a double-structure silicon-on-insulator (SOI) substrate, the thicker portion provides a core along a predetermined path and the first insulator layer and the second insulator layer abutting the thicker portion provide clads forming an optical waveguide along the predetermined path.

13. The semiconductor device according to claim 12, wherein the double-structure SOI substrate is integrated in a first central processing unit and a second processing unit enabling optical communication.

14. The semiconductor device according to claim 12, wherein the first semiconductor layer, the first insulator layer, the second semiconductor layer, the second insulator layer, and the silicon substrate are formed consecutively.

15. The semiconductor device according to claim 3, wherein digital logic, a central processing unit, or a memory, is formed on the first semiconductor layer.

16. The semiconductor device according to claim 3, wherein the substrate is a silicon substrate, the first semiconductor layer and the second semiconductor layer are silicon layers, and the first insulation film and the second insulation film are silicon oxide.

17. The semiconductor device according to claim 3, wherein the thicker portion extends toward the substrate.

18. The semiconductor device according to claim 3, wherein an upper portion of the thicker portion horizontally aligns with the first insulator layer, and wherein a lower portion of the thicker portion extends into the substrate below.

* * * * *